(12) United States Patent
Tong et al.

(10) Patent No.: US 11,641,748 B2
(45) Date of Patent: May 2, 2023

(54) PRETREATMENT METHOD OF SELECTOR DEVICE

(71) Applicant: HUAZHONG UNIVERSITY OF SCIENCE AND TECHNOLOGY, Hubei (CN)

(72) Inventors: Hao Tong, Hubei (CN); Da He, Hubei (CN); Xiangshui Miao, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 428 days.

(21) Appl. No.: 17/042,954

(22) PCT Filed: Jul. 12, 2019

(86) PCT No.: PCT/CN2019/095696
§ 371 (c)(1),
(2) Date: Sep. 29, 2020

(87) PCT Pub. No.: WO2020/206858
PCT Pub. Date: Oct. 15, 2020

(65) Prior Publication Data
US 2021/0242280 A1 Aug. 5, 2021

(30) Foreign Application Priority Data
Apr. 12, 2019 (CN) .......................... 201910293381.X

(51) Int. Cl.
*H01L 27/24* (2006.01)
*H01L 45/00* (2006.01)

(52) U.S. Cl.
CPC .......... *H01L 27/2427* (2013.01); *H01L 45/16* (2013.01)

(58) Field of Classification Search
None
See application file for complete search history.

(56) References Cited

FOREIGN PATENT DOCUMENTS

| CN | 102129886 | 7/2011 |
|----|-----------|--------|
| CN | 106992251 | 7/2017 |

(Continued)

OTHER PUBLICATIONS

"International Search Report (Form PCT/ISA/210) of PCT/CN2019/095696," dated Jan. 9, 2020, pp. 1-5.

*Primary Examiner* — Marvin Payen
(74) *Attorney, Agent, or Firm* — JCIP Global Inc.

(57) ABSTRACT

A pretreatment method of a selector device is provided, which includes: (1) performing a first voltage scan of a selector through selecting a voltage scan range and setting a first limit current $I_{cc1}$ to obtain a resistance state $R_1$ of a sub-threshold region thereof; (2) setting an $n^{th}$ limit current $I_{cc(n)}$ and performing an $n^{th}$ voltage scan of the selector according to a resistance state $R_{n-1}$ of a sub-threshold region of the selector after an n-1$^{th}$ voltage scan to obtain a resistance state $R_n$ of a sub-threshold region thereof, where, $I_{cc(n-1)} < I_{cc(n)}$, and an initial value of n is 2; and (3) stopping a voltage scan of the selector device under a read voltage is applied when a resistance value of a high resistance state of the selector device after the $n^{th}$ voltage scan is greater than a resistance value of a high resistance state of the selector device after the first voltage scan; otherwise, n=n+1, and returning to Step (2).

14 Claims, 7 Drawing Sheets

(56) References Cited

FOREIGN PATENT DOCUMENTS

| WO | 2017124873 | 7/2017 |
|----|------------|--------|
| WO | 2019009296 | 1/2019 |

PRETREATMENT METHOD OF SELECTOR DEVICE

CROSS-REFERENCE TO RELATED APPLICATION

This application is a 371 of international application of PCT application serial no. PCT/CN2019/095696, filed on Jul. 12, 2019, which claims the priority benefit of China application no. 201910293381.X, filed on Apr. 12, 2019. The entirety of each of the above mentioned patent applications is hereby incorporated by reference herein and made a part of this specification.

BACKGROUND

Technical Field

The disclosure relates to the field of micro-nano, and more specifically relates to a pretreatment method of a selector device.

Description of Related Art

The next generation of new non-volatile memory, such as phase change memory, resistive random access memory, and other devices, has become the most popular next-generation memory due to characteristics of extremely fast erasing and writing speed, excellent miniaturization performance, three-dimensional stackability, etc. Today, when Moore's Law is becoming invalid, three-dimensionally stacked memory cells can reduce the effective cell area, thereby greatly increasing the storage density. However, after the memory cells are three-dimensionally stacked, a huge leakage current will inevitably be generated during the operating process, leading to misoperation of non-selected cells. In order to solve the above issue, a two-end selector device is used to be vertically integrated with the memory cells, and the high impedance of the selector is used to effectively suppress the leakage current while reducing the operating power consumption.

In order to increase the scale of the integrated array, the selector must be able to withstand the huge current when the memory cells are erased and written while effectively suppressing the leakage current of the non-selected cells. In other words, the selector needs to have a large on/off ratio. The on/off ratio of the selector directly determines the number of memory cells that can be integrated, and can also affect the magnitude of power consumption and the level of crosstalk resistance of the memory.

The ovonic threshold switch (OTS) of a gating layer usually composed of a chalcogenide compound can effectively meet the above requirements. However, the currently reported OTS selectors have shortcomings such as small on/off ratio, poor stability, and insufficient drive current. On the one hand, in order to increase the on/off ratio, the most direct way is to reduce the leakage current through reducing the number of defects in the chalcogenide material. Current technology often reduces the number of defects by doping other elements, but the introduction of new elements requires precise regulation of the component ratio, which increases the complexity of the process, increases the requirements for the uniformity and consistency of the film forming technology, and reduces the yield. On the other hand, since the chalcogenide material tend to undergo phase change due to the actions of voltage and heat when the current is too high, the off-state resistance is reduced, which limits the maximum drive current.

Therefore, how to improve the on/off ratio, stability, and drive current of the selector device through a simpler operating method is a top priority.

SUMMARY

In view of the defects of the prior art, the objective of the disclosure is to provide a pretreatment method of a selector device, which aims to solve the technical issue that the high on/off ratio and the high on-state current present in the existing selector technology cannot be implemented at the same time, which limits the application of the selector in storage devices.

In order to implement the above objective, the disclosure provides a pretreatment method of a selector device, including the following steps.

(1) A first voltage scan is performed on the selector through selecting a voltage scan range and setting a first limit current $I_{cc1}$ to obtain a resistance state $R_1$ of a sub-threshold region thereof.

(2) The $n^{th}$ limit current $I_{cc(n)}$ is set and the $n^{th}$ voltage scan of the selector is performed according to a resistance state of a sub-threshold region of the selector after the $n-1^{th}$ voltage scan to obtain a resistance state $R_n$ of a sub-threshold region thereof, where, $I_{cc(n-1)} < I_{cc(n)}$, and the initial value of n is 2.

(3) A voltage scan of the selector device is stopped under a read voltage is applied when a resistance value of a high resistance state of the selector device after the $n^{th}$ voltage scan is greater than a resistance value of a high resistance state of the selector device after the first voltage scan. Otherwise, n=n+1, and return to Step (2).

Preferably, the read voltage is 0.5 times of a threshold voltage of the selector device after the first voltage scan.

Preferably, the first limit current $I_{cc1}$ is 500 nA<$I_{cc1}$<1000 uA. The $n^{th}$ limit current $I_{cc(n)}$ is $I_{cc(n-1)} < I_{cc(n)}$<1100 uA.

Preferably, the voltage scan range is 0 to 4 $V_{th}$. The voltage scan manner is that the voltage is progressively increased from 0 to a maximum voltage, and then scans back to 0 from the maximum voltage. $V_{th}$ is the threshold voltage of the selector.

Preferably, the selector includes a first electrode layer, a chalcogenide gating material layer, and a second electrode layer. The chalcogenide gating material layer is between the first electrode layer and the second electrode layer.

Preferably, the material of the chalcogenide gating material layer is at least one of $SiTe_x$, $CTe_x$, $BTe_x$, $GeTe_x$, $AlTe_x$, $GeSb_xTe_y$, $GeSb_x$, $BiTe_x$, $AsTe_x$, $SnTe_x$, and $BiTe_x$; a mixture formed from at least one compound of $SiTe_x$, $CTe_x$, $BTe_x$, $GeTe_x$, $AlTe_x$, $GeSb_xTe_y$, $GeSb_x$, $BiTe_x$, $AsTe_x$, $SnTe_x$, and $BiTe_x$ doped with at least one element of N, Sb, Bi, and C; or a mixture formed from at least one compound of $SiTe_x$, $CTe_x$, $BTe_x$, $GeTe_x$, $AlTe_x$, $GeSb_xTe_y$, $GeSb_x$, $BiTe_x$, $AsTe_x$, $SnTe_x$, and $BiTe_x$ doped with Si element.

Preferably, both the first electrode layer and the second electrode layer are inert electrode materials, and the inert electrode materials are at least one of W, TiW, Pt, Au, Ru, Al, TiN, Ta, TaN, $IrO_2$, ITO, and IZO.

DETAILED DESCRIPTION OF DISCLOSED EMBODIMENTS

Figure 1:
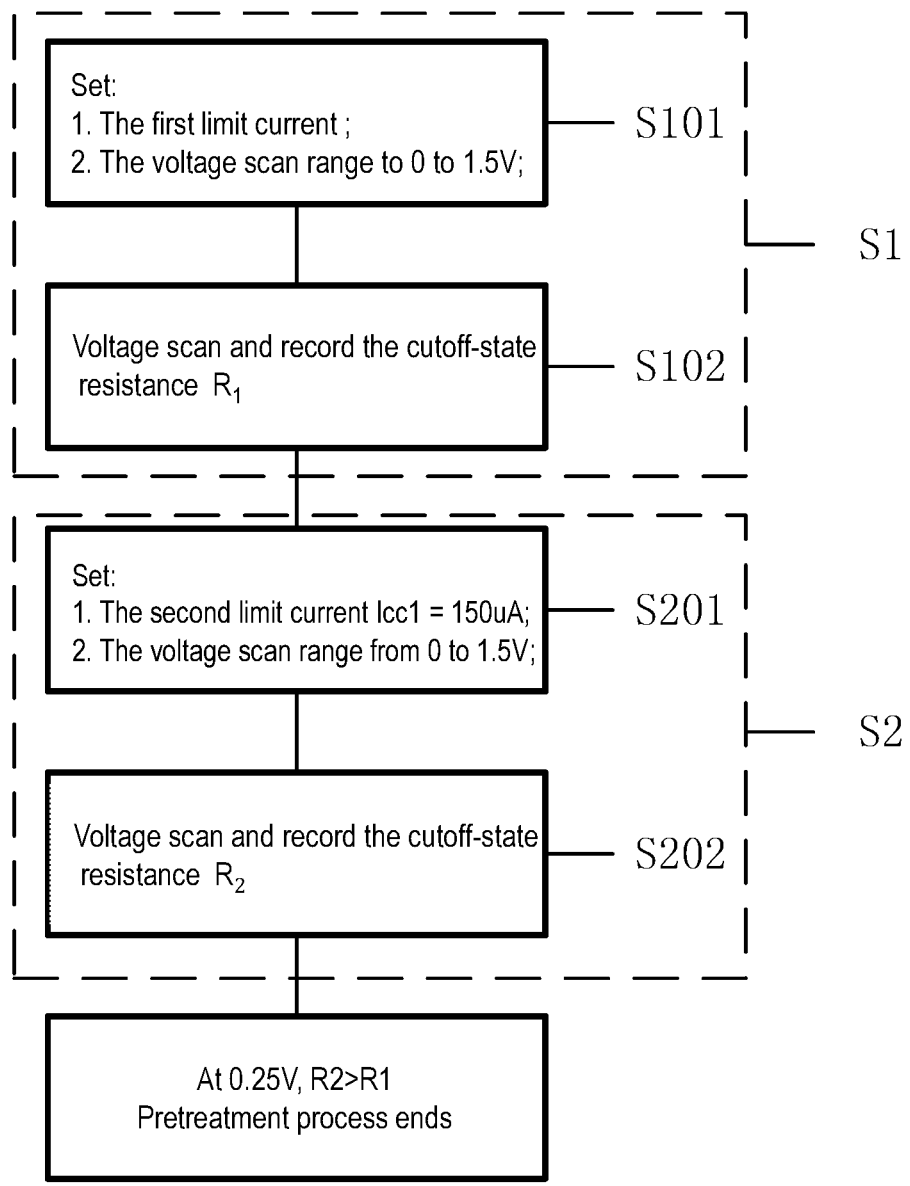
FIG. 1 is a schematic flowchart of a pretreatment method of a selector according to Embodiment 1.

For the objective, technical solution, and advantages of the disclosure to be clearer, the disclosure is further described in detail below with reference to the accompanying drawings and the embodiments. It should be understood that the specific embodiments described here are only used to explain the disclosure, but not to limit the disclosure.

The disclosure provides a pretreatment method of a selector device, including the following steps.

In order to implement the above objective, the disclosure provides a pretreatment method of a selector device, including the following steps.

(1) A first voltage scan is performed on the selector through selecting a voltage scan range and setting a first limit current $I_{cc1}$ to obtain a resistance state $R_1$ of a sub-threshold region thereof.

(2) The $n^{th}$ limit current $I_{cc(n)}$ is set and the $n^{th}$ voltage scan of the selector is performed according to a resistance state $R_{n-1}$ of a sub-threshold region of the selector after the $n-1^{th}$ voltage scan to obtain a resistance state $R_n$ of a sub-threshold region thereof, where, $I_{cc(n-1)} < I_{cc(n)}$, and the initial value of n is 2.

(3) A voltage scan of the selector device is stopped under a read voltage is applied when a resistance value of a high resistance state of the selector device after the $n^{th}$ voltage scan is compared with a resistance value of a high resistance state of the selector device after the first voltage scan, and a threshold condition is satisfied. Otherwise, n=n+1, and return to Step (2).

Preferably, the read voltage is 0.5 times of a threshold voltage of the selector device after the first voltage scan.

Preferably, the first limit current $I_{cc1}$ is 500 nA<$I_{cc1}$<1000 uA. The $n^{th}$ limit current $I_{cc(n)}$ is $I_{cc(n-1)}$<$I_{cc(n)}$<1100 uA.

Preferably, the voltage scan range is 0 to 4 $V_{th}$. The voltage scan manner is that the voltage is progressively increased from 0 to a maximum voltage, and then scans back to 0 from the maximum voltage. $V_{th}$ is the threshold voltage of the selector.

Preferably, the selector includes a first electrode layer, a chalcogenide gating material layer, and a second electrode layer. The chalcogenide gating material layer is between the first electrode layer and the second electrode layer.

Preferably, the material of the chalcogenide gating material layer is at least one of $SiTe_x$, $CTe_x$, $BTe_x$, $GeTe_x$, $AlTe_x$, $GeSb_xTe_y$, $GeSb_x$, $BiTe_x$, $AsTe_x$, $SnTe_x$, and $BiTe_x$; a mixture formed from at least one compound of $SiTe_x$, $CTe_x$, $BTe_x$, $GeTe_x$, $AlTe_x$, $GeSb_xTe_y$, $GeSb_x$, $BiTe_x$, $AsTe_x$, $SnTe_x$, and $BiTe_x$ doped with at least one element of N, Sb, Bi, and C; or a mixture formed from at least one compound of $SiTe_x$, $CTe_x$, $BTe_x$, $GeTe_x$, $AlTe_x$, $GeSb_xTe_y$, $GeSb_x$, $BiTe_x$, $AsTe_x$, $SnTe_x$, and $BiTe_x$ doped with Si element.

Preferably, both the first electrode layer and the second electrode layer are inert electrode materials, and the inert electrode materials are at least one of W, TiW, Pt, Au, Ru, Al, TiN, Ta, TaN, $IrO_2$, ITO, and IZO.

The pretreatment method of the selector device provided by the disclosure is applicable to all types of selectors whose switch layer is a chalcogenide gating material layer, and is not limited to the above selectors.

Embodiment 1

In the embodiment, the chalcogenide gating material layer of the selector device is $GeTe_x$, and both the first electrode layer and the second electrode layer are TiW. In the pretreatment method of the selector device, the voltage scan range is set to 0V to 1.5V. The voltage scan range remains unchanged during the pretreatment process. The pretreatment process is shown in FIG. 1, which is specifically as follows.

Figure 2:
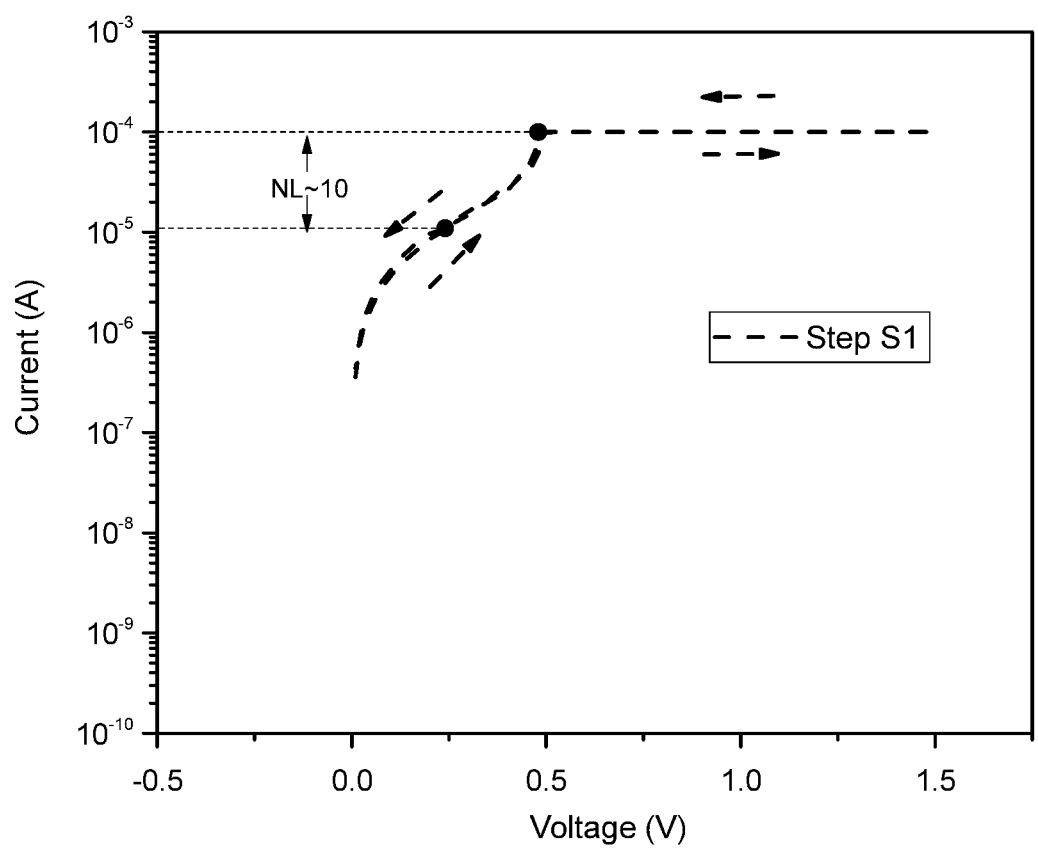
FIG. 2 is a voltage-current curve diagram of the selector after S1 in Embodiment 1.

S1: The first limit current $I_{cc1}$=100 uA is set. The first voltage scan is performed. The I-V characteristic curve as shown in FIG. 2 and the resistance state $R_1$ of the sub-threshold region thereof are obtained. As shown in FIG. 2, the on/off ratio of the selector is 10.

Through the operation of S1, on the one hand, the initial state data of the selector is obtained, and on the other hand, under the actions of field-induced effect and current heating effect, the defect that some internal parts of the selector material are too concentrated is eliminated. At the same time, since the limit current is smaller, there will not be issues such as material crystallization.

S2: The first limit current $I_{cc2}$=1.5 $I_{cc1}$=150 uA is set. A second voltage scan is performed. The I-V characteristic curve as shown in FIG. 3 and the resistance state $R_2$ of the sub-threshold region thereof are obtained.

Figure 3:
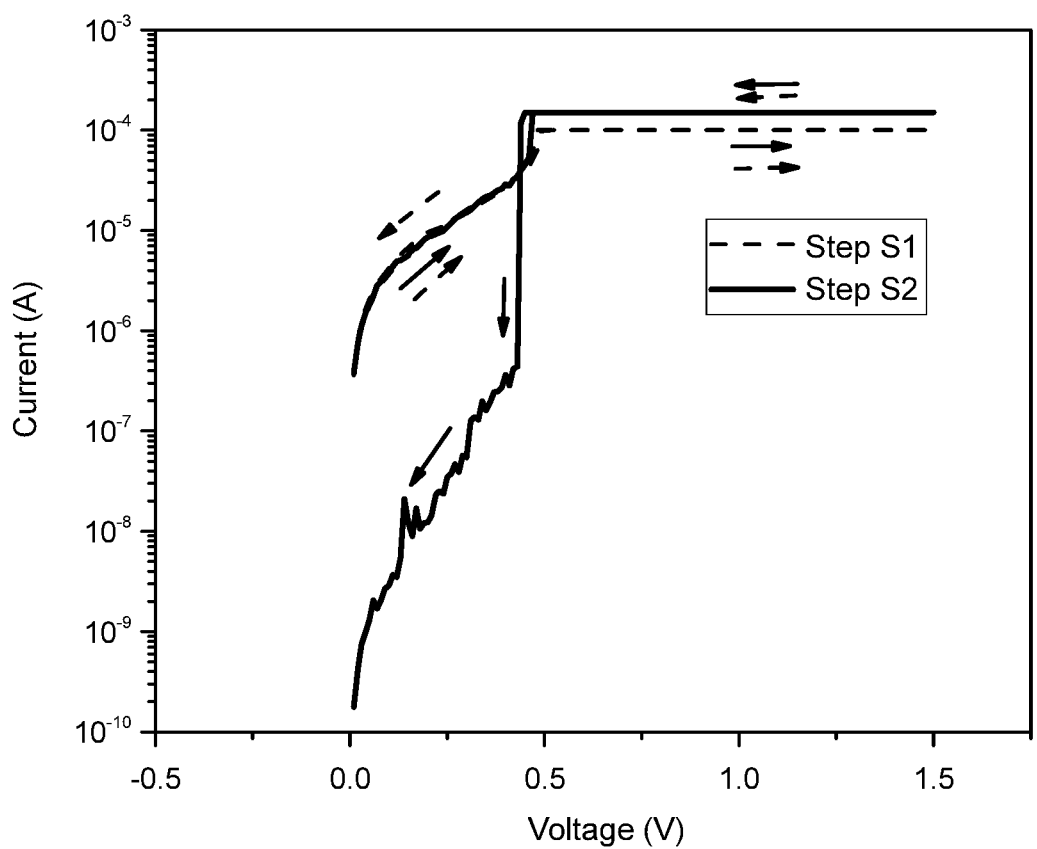
FIG. 3 is a voltage-current curve comparison diagram of the selector after S1 and after S1 and S2 in Embodiment 1.

The dotted line in FIG. 3 represents the curve obtained by S1, and the solid line represents the curve obtained by step S2. It can be seen from FIG. 3 that during the voltage flyback process of S2, the leakage current after the selector is closed is significantly reduced. S2 further reduces the number of defects in the selector material through increasing the limit current. At the same time, since pretreatment of Si eliminates the defect of some being too concentrated, S2 can still prevent damage to the device while increasing the limit current.

S3: The read voltage $V_{read}$=0.25V is set. It is known that $$\frac{R_2}{R_1} > 1$$

under the read voltage. The voltage scan of the selector device is stopped.

When the step satisfies the condition of $$\frac{R_n}{R_1} > 1$$

under the read voltage, it illustrates that the voltage scan enables the resistance state of the sub-threshold region of the selector to be improved.

In order to more intuitively illustrate that the performance of the selector device has been improved after pretreatment, a third voltage scan is performed as a verification test, which is specifically as follows.

A third limit current $I_{cc3}$=2$I_{cc1}$=200 uA is set and the third voltage scan is performed. The I-V characteristic curve shown in FIG. 4 and the on/off ratio of the selector are obtained.

Figure 4:
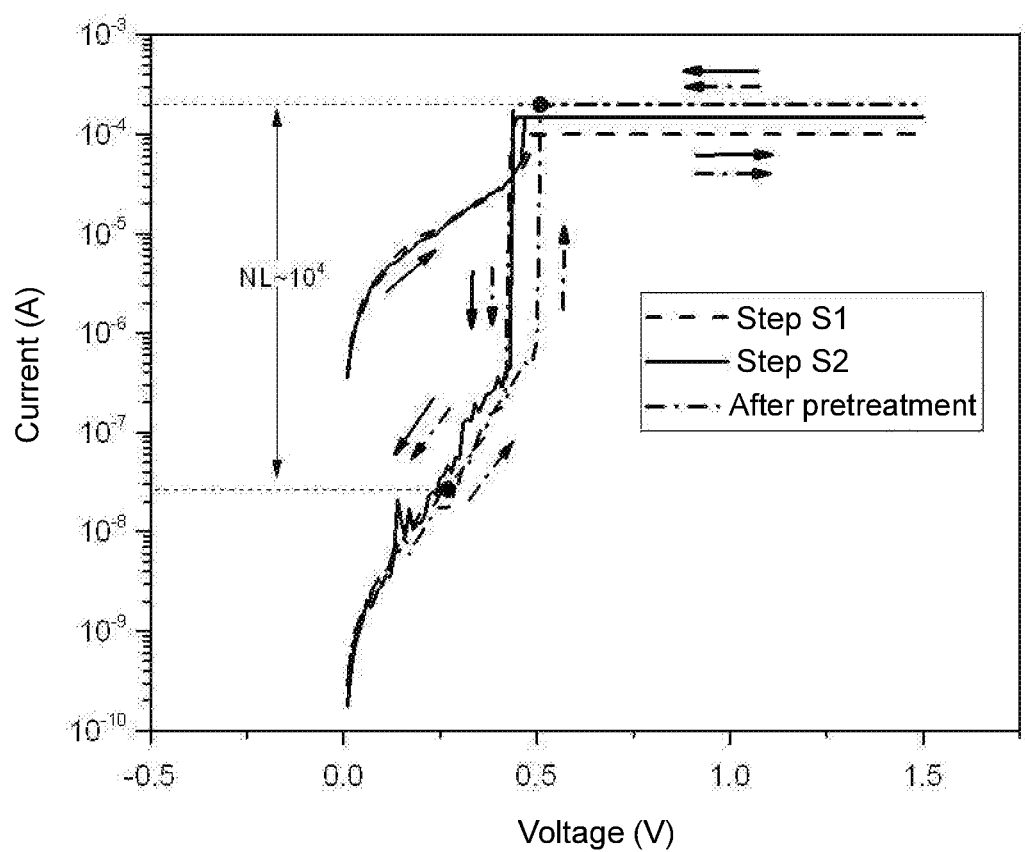
FIG. 4 is a voltage-current curve comparison diagram of the selector after S1, after S1 and S2, and after a verification test in Example 1.

In FIG. 4, the solid line is the I-V curve obtained after pretreatment of S1 and S2. The dotted line is the I-V curve obtained after the verification test. It can be seen from FIG. 4 that after Steps S1 and S2, the on/off ratio is increased by 1000 times to reach $10^4$ as compared to after the first voltage scan.

Embodiment 2

In the embodiment, the chalcogenide gating material layer of the selector device is $GeSb_xTe_y$, and both the first electrode layer and the second electrode layer are TiW.

In the pretreatment method of a first cell of the selector device, the voltage scan range is set to 0V to 1.5V. The voltage scan range remains unchanged during the pretreatment process. The pretreatment process is specifically as follows.

S1: The first limit current $I_{cc1}$=400 uA is set. The first voltage scan is performed. The I-V characteristic curve of the selector and the resistance state $R_1$ of the sub-threshold region thereof are obtained.

S2: The second limit current $I_{cc2}$=500 uA is set. The second voltage scan is performed. The resistance state $R_2$ of the sub-threshold region of the selector is obtained.

S3: The read voltage $V_{read}$=0.3V is set. It is known that $$\frac{R_2}{R_1} > 1$$

under the read voltage. The voltage scan of the selector device is stopped.

Figure 5:
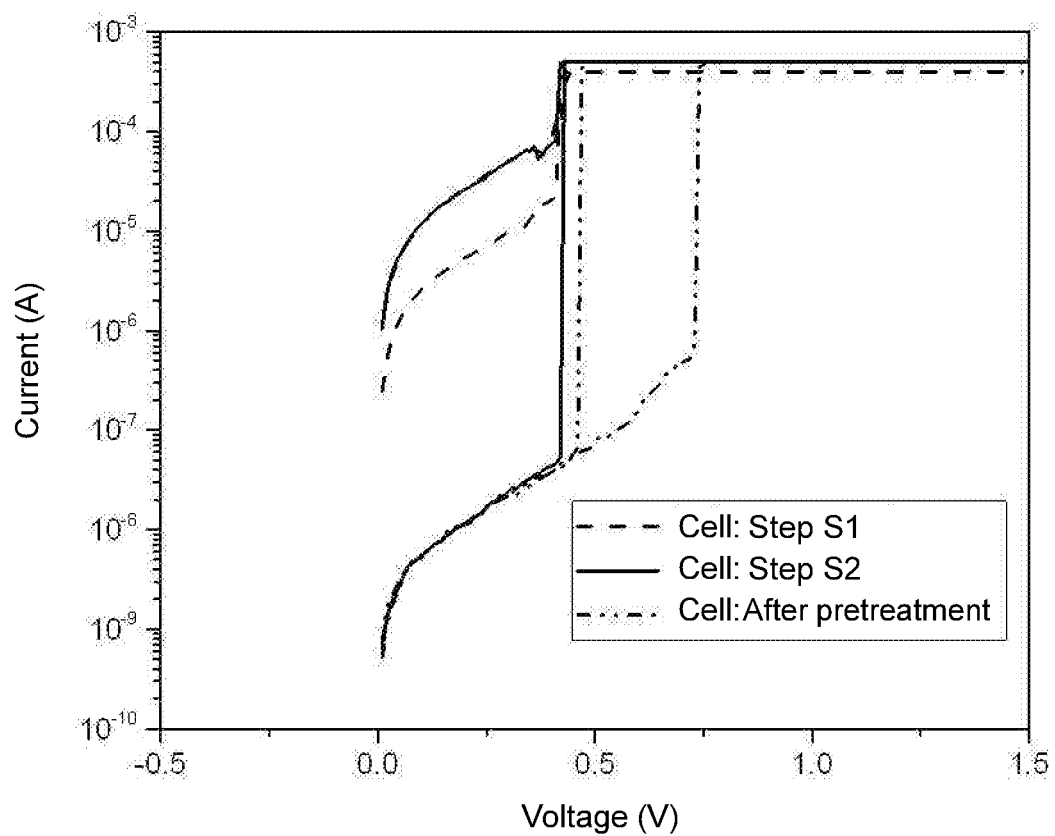
FIG. 5 is a voltage-current curve diagram of a selector obtained during a pretreatment process in Embodiment 2.

In order to more intuitively illustrate that the performance of the selector device has been improved after pretreatment, the third voltage scan is performed. The I-V characteristic curve as shown in FIG. 5 is obtained. It can be seen from FIG. 5 that after pretreatment, the on/off ratio of the selector is increased from less than 10 to $10^4$ magnitude.

A second cell of the selector device is exactly the same as the first cell of the selector device. The limit current is directly set to $I_{cc}=I_{cc2}$=500 uA. The I-V curve as shown by the solid line in FIG. 6 is obtained.

Figure 6:
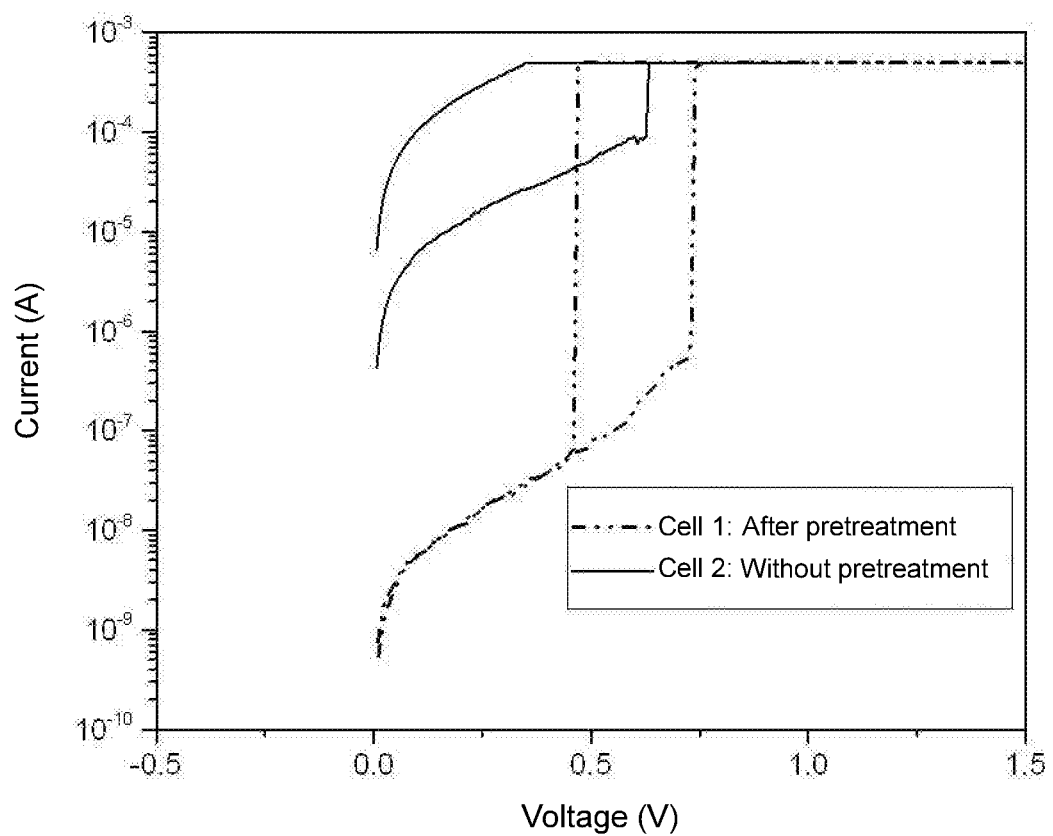
FIG. 6 is a voltage-current curve diagram of a selector without pretreatment in Embodiment 2.

The dotted line in FIG. 6 is the I-V curve corresponding to the first cell of the selector device. Comparing the I-V curves represented by the solid line and the dotted line in FIG. 6, it can be seen that the second cell undergoes a phase change under the on-state current of 500 uA and fails to return to the high impedance state. At this time, the on/off ratio of the device is close to 0. The first cell remains stable and has better on/off characteristic under the on-state current of 500 uA.

Embodiment 3

Figure 7:
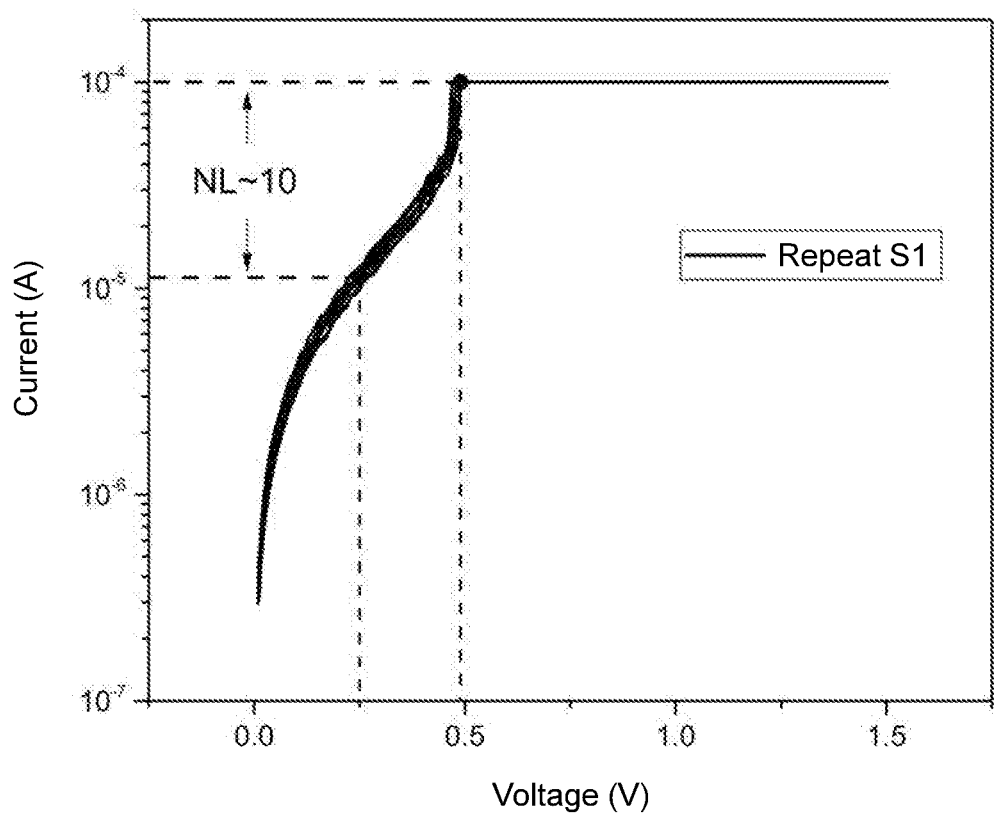
FIG. 7 is a voltage-current curve diagram of a selector obtained during a pretreatment process in Embodiment 3.

In the embodiment, the chalcogenide gating material layer of the selector device is $GeTe_x$, and both the first electrode layer and the second electrode layer are TiW. The limit current is set to $I_{cc1}$=100 uA. The voltage scan of the selector is repeated 7 times. The I-V curve as shown in FIG. 7 is obtained. From FIG. 7, it can be seen that if the limit current remains unchanged during pretreatment, the on/off ratio remains at about 10. The repetition of the voltage scan does not improve the performance of the selector device. Comparing Embodiment 1 with Embodiment 3, it can be seen that the pretreatment method of the selector provided by the disclosure may increase the on-state current while implementing the high on/off ratio of the selector through continuously increasing the limit current.

Persons skilled in the art can easily understand that the above descriptions are only preferred embodiments of the disclosure and are not intended to limit the disclosure. Any modification, equivalent replacement, and improvement, etc. made within the spirit and principle of the disclosure should be included in the protection scope of the disclosure.

Compared with the prior art, the above technical solution conceived by the disclosure can achieve the following beneficial effects.

(1) Through limiting the increase in current at least twice, the disclosure performs pretreatment of the voltage scan of the selector, which can effectively reduce the number of defects in the selector material, thereby effectively reducing the leakage current of the selector and improving the on/off ratio.

(2) Since the defect distribution and element distribution in the deposited material are very uneven, there may be excessive heat in some areas of the material when a larger high on-state current passes through, causing the device to be easily damaged. Therefore, the disclosure adopts the continuous increase of the limit current at least twice to ensure the implementation of the high on/off ratio while preventing the phenomenon of device damage caused by passing through the excessive limit current once. In short, the pretreatment method adopted by the disclosure can increase the on-state current of the selector.

(3) The pretreatment method of the selector provided by the disclosure is an electrical treatment method, which is very simple and stable. The pretreatment method is different from techniques such as doping, which will increase the process requirements. The pretreatment method not only effectively reduces the number of defects in the selector material, but also instantaneously and accurately observes the changes in device performance.

What is claimed is:

1. A pretreatment method of a selector device, the method comprising:

Step (1) of performing a first voltage scan of a selector through selecting a voltage scan range and setting a first limit current $I_{cc1}$ to obtain a resistance state $R_1$ of a sub-threshold region thereof;

Step (2) of setting an $n^{th}$ limit current $I_{cc(n)}$ and performing an $n^{th}$ voltage scan of the selector according to a resistance state $R_{n-1}$ of a sub-threshold region of the selector after an $n-1^{th}$ voltage scan to obtain a resistance state $R_n$ of a sub-threshold region thereof, where, $I_{cc(n-1)} < I_{cc(n)}$, and an initial value of n is 2; and Step (3) of stopping a voltage scan of the selector device under a read voltage is applied when a resistance value of a high resistance state of the selector device after the $n^{th}$ voltage scan is greater than a resistance value of a high resistance state of the selector device after the first voltage scan; otherwise, n=n+1, and returning to Step (2).

2. The pretreatment method according to claim 1, wherein the read voltage is 0.5 times of a threshold voltage of the selector device after the first voltage scan.

3. The pretreatment method according to claim 1, wherein the first limit current $I_{cc1}$ is 500 nA<1000 uA; and the $n^{th}$ limit current $I_{cc(n)}$ is $I_{cc(n-1)} < I_{cc(n)} < 1100$ uA.

4. The pretreatment method according to claim 3, wherein
the voltage scan range is 0 to 4 $V_{th}$; and
a manner of the voltage scan is that the voltage is progressively increased from 0 to a maximum voltage, and then scans back to 0 from the maximum voltage; where, $V_{th}$ is the threshold voltage of the selector.

5. The pretreatment method according to claim 4, wherein the selector comprises a first electrode layer, a chalcogenide gating material layer, and a second electrode layer; and the chalcogenide gating material layer is between the first electrode layer and the second electrode layer.

6. The pretreatment method according to claim 5, wherein a material of the chalcogenide gating material layer is at least one of $SiTe_x$, $CTe_x$, $BTe_x$, $GeTe_x$, $AlTe_x$, $GeSb_xTe_y$, $GeSb_x$, $BiTe_x$, $AsTe_x$, $SnTe_x$, and $BiTe_x$; a mixture formed from at least one compound of $SiTe_x$, $CTe_x$, $BTe_x$, $GeTe_x$, $AlTe_x$, $GeSb_xTe_y$, $GeSb_x$, $BiTe_x$, $AsTe_x$, $SnTe_x$, and $BiTe_x$ doped with at least one element of N, Sb, Bi, and C; or a mixture formed from at least one compound of $SiTe_x$, $CTe_x$, $BTe_x$, $GeTe_x$, $AlTe_x$, $GeSb_xTe_y$, $GeSb_x$, $BiTe_x$, $AsTe_x$, $SnTe_x$, and $BiTe_x$ doped with Si element.

7. The pretreatment method according to claim 4, wherein both the first electrode layer and the second electrode layer are inert electrode materials, and the inert electrode materials are at least one of W, TiW, Pt, Au, Ru, Al, TiN, Ta, TaN, $IrO_2$, ITO, and IZO.

8. The pretreatment method according to claim 5, wherein both the first electrode layer and the second electrode layer are inert electrode materials, and the inert electrode materials are at least one of W, TiW, Pt, Au, Ru, Al, TiN, Ta, TaN, $IrO_2$, ITO, and IZO.

9. The pretreatment method according to claim 2, wherein the first limit current $I_{cc1}$ is 500 nA<$I_{cc1}$<1000 uA; and the $n^{th}$ limit current $I_{cc(n)}$ is $I_{cc(n-1)}$<$I_{cc(n)}$<1100 uA.

10. The pretreatment method according to claim 9, wherein
the voltage scan range is 0 to 4 $V_{th}$; and
a manner of the voltage scan is that the voltage is progressively increased from 0 to a maximum voltage, and then scans back to 0 from the maximum voltage; where, $V_{th}$ is the threshold voltage of the selector.

11. The pretreatment method according to claim 10, wherein the selector comprises a first electrode layer, a chalcogenide gating material layer, and a second electrode layer; and the chalcogenide gating material layer is between the first electrode layer and the second electrode layer.

12. The pretreatment method according to claim 11, wherein a material of the chalcogenide gating material layer is at least one of $SiTe_x$, $CTe_x$, $BTe_x$, $GeTe_x$, $AlTe_x$, $GeSb_xTe_y$, $GeSb_x$, $BiTe_x$, $AsTe_x$, $SnTe_x$, and $BiTe_x$; a mixture formed from at least one compound of $SiTe_x$, $CTe_x$, $BTe_x$, $GeTe_x$, $AlTe_x$, $GeSb_xTe_y$, $GeSb_x$, $BiTe_x$, $AsTe_x$, $SnTe_x$, and $BiTe_x$ doped with at least one element of N, Sb, Bi, and C; or a mixture formed from at least one compound of $SiTe_x$, $CTe_x$, $BTe_x$, $GeTe_x$, $AlTe_x$, $GeSb_xTe_y$, $GeSb_x$, $BiTe_x$, $AsTe_x$, $SnTe_x$, and $BiTe_x$ doped with Si element.

13. The pretreatment method according to claim 10, wherein both the first electrode layer and the second electrode layer are inert electrode materials, and the inert electrode materials are at least one of W, TiW, Pt, Au, Ru, Al, TiN, Ta, TaN, $IrO_2$, ITO, and IZO.

14. The pretreatment method according to claim 11, wherein both the first electrode layer and the second electrode layer are inert electrode materials, and the inert electrode materials are at least one of W, TiW, Pt, Au, Ru, Al, TiN, Ta, TaN, $IrO_2$, ITO, and IZO.

* * * * *